US008556079B2

United States Patent
Pylant et al.

(10) Patent No.: US 8,556,079 B2
(45) Date of Patent: *Oct. 15, 2013

(54) WAFER CONTAINER WITH ADJUSTABLE INSIDE DIAMETER

(75) Inventors: James D Pylant, Temecula, CA (US); Alan L Waber, Wildomar, CA (US); Christopher R Mack, Broomfield, CO (US)

(73) Assignee: Texchem Advanced Products Incorporated Sdn Bhd, Penang (MY)

( * ) Notice: Subject to any disclaimer, the term of this patent is extended or adjusted under 35 U.S.C. 154(b) by 406 days.

This patent is subject to a terminal disclaimer.

(21) Appl. No.: 12/749,448

(22) Filed: Mar. 29, 2010

(65) Prior Publication Data

US 2010/0236977 A1 Sep. 23, 2010

Related U.S. Application Data

(63) Continuation-in-part of application No. 12/548,368, filed on Aug. 26, 2009, now Pat. No. 8,109,390, and a continuation-in-part of application No. 12/606,921, filed on Oct. 27, 2009.

(51) Int. Cl.
*B65D 85/30* (2006.01)

(52) U.S. Cl.
USPC .................. 206/710; 206/303; 206/454

(58) Field of Classification Search
USPC .......... 206/710–712, 454, 449, 303, 1.5, 722, 206/308.1, 307.1; 438/460, 464; 220/326, 220/4.21, 4.24, 324, 315, 675, 669; 211/41.18
See application file for complete search history.

(56) References Cited

U.S. PATENT DOCUMENTS

| 3,552,548 A | 1/1971 | Wallestad |
| 5,024,329 A | 6/1991 | Grohrock |
| 5,207,324 A | 5/1993 | Kos |
| 5,402,890 A | 4/1995 | Yajima et al. |
| 5,960,960 A | 10/1999 | Yamamoto |
| 6,105,817 A * | 8/2000 | Ponton .......................... 220/784 |
| 6,193,068 B1 | 2/2001 | Lewis et al. |
| 6,341,695 B1 | 1/2002 | Lewis et al. |

(Continued)

FOREIGN PATENT DOCUMENTS

| KR | 2005-113889 | 12/2005 |
| KR | 0414886 | 4/2006 |

(Continued)

*Primary Examiner* — J. Gregory Pickett
*Assistant Examiner* — Ernesto Grano
(74) *Attorney, Agent, or Firm* — Sam K. Tahmassebi; TechLaw LLP

(57) ABSTRACT

Improvements in a semiconductor wafer container for reducing movement of semiconductor wafers within a wafer carrier using flexible wall segments, panels or flexible inserts in the base member's main inner containment diameter. These walls allow a vertical containment surface to move and capture the entire stack of wafers rather than a few wafers. The surface that contacts the wafers moves uniformly inward. The wafer stack is secured by reducing or eliminating the gap between the wafer container and the wafer stack. Further improvements include the addition of a ramped engagement surfaces in the top and/or bottom cover that provides mechanical advantage for easier assembly of the top and bottom cover. This design also allows for automated loading and unloading of the wafer stack because once the top cover is removed, the flexible walls spring back outward. Thus providing a small gap in which to freely remove the wafers.

20 Claims, 4 Drawing Sheets

(56) References Cited

U.S. PATENT DOCUMENTS

| | | |
|---|---|---|
| 6,533,123 B1 | 3/2003 | Nakamura et al. |
| 6,550,619 B2 | 4/2003 | Bores et al. |
| 6,564,946 B2 | 5/2003 | Lewis et al. |
| 6,588,616 B1 * | 7/2003 | Ho ................................ 220/4.03 |
| 6,662,950 B1 | 12/2003 | Cleaver |
| 6,988,620 B2 | 1/2006 | Haggard et al. |
| 6,988,621 B2 | 1/2006 | Forsyth |
| 7,040,487 B2 | 5/2006 | Zabka et al. |
| 7,100,772 B2 | 9/2006 | Burns et al. |
| 7,131,248 B2 | 11/2006 | Pylant |
| RE40,513 E | 9/2008 | Krampotich et al. |
| 7,565,980 B2 * | 7/2009 | Forsyth et al. ............... 206/710 |
| 2005/0269241 A1 * | 12/2005 | Brooks et al. ................. 206/710 |
| 2006/0042998 A1 | 3/2006 | Haggard et al. |
| 2007/0095838 A1 * | 5/2007 | Roesler .......................... 220/326 |
| 2009/0095650 A1 | 4/2009 | Pylant et al. |

FOREIGN PATENT DOCUMENTS

| | | |
|---|---|---|
| WO | WO 9700820 | 1/1997 |
| WO | WO 9958412 | 11/1999 |
| WO | WO 2004087535 | 10/2004 |
| WO | WO 2005019065 | 3/2005 |
| WO | WO 2005044695 | 5/2005 |
| WO | WO 2006125859 | 11/2006 |

* cited by examiner

WAFER CONTAINER WITH ADJUSTABLE INSIDE DIAMETER

CROSS REFERENCE TO RELATED APPLICATION

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC

Not Applicable

BACKGROUND OF THE INVENTION

1. Field of the Invention

This invention relates to improvements in a container for the transportation of semiconductor wafers. More particularly, the present wafer container includes improvements in clamping sidewalls that prevent movement to the wafers.

2. Description of Related Art Including Information Disclosed Under 37 CFR 1.97 and 1.98

In the processing of semiconductor wafers the typically must be transported either between processes or to other facilities. The semiconductor wafers are fragile and damage to the surface of the wafers can make the wafer useless for the intended purpose. Because of the high potential for damage to the wafer the semiconductors must be packaged and transported to minimize harm. In transportation, multiple semiconductor wafers are stacked into a transportation container. There have been a number of containment products and patents have been sold and patented to try and minimize damage to these silicon wafers. Exemplary examples of patents covering these products are disclosed herein.

U.S. Patent Publication Number US2006/0042998 that was published on Mar. 2, 2006 to Clifton C. Haggard et al., discloses using a cushion insert that is placed on top of the wafers. When the lid is closed on top of the cushion insert, the support portions push on the inside of the lid. This causes the cushioning member to conform around the wafer at contact points. While this reference minimizes movement of the wafers, the wafers are stored vertically and the cushioning is applied on the closing side of the enclosure. The closing of the carrier pushes down on the cushion instead of sliding on the cushion. The cushion is further not integrated with the enclosure, and exists as a separate component.

U.S. Pat. No. 7,100,772 issued Sep. 5, 2006 to John Burns et al., disclose a containment device for retaining semiconductor wafers with several methods of pushing on the sides of a semiconductor wafer. In all of the embodiments, one half of the housing interacts with an arm located in the second half of the housing to press on the sides of the semiconductor wafer. In one embodiment, a spring loaded pistons push on branch members. In another embodiment, an arm on a living hinge is pushed to make contact with the wafer. While this patent discloses a wafer carrier that reduces movement of the wafers, the wafers are stored vertically and the cushioning is applied on the closing side of the enclosure. The closing of the carrier pushes down on the cushion instead of sliding on the cushion. This patent uses multiple arms, one for each wafer. The top housing pushed down on the cushion instead of sliding on the arms to provide the cushion.

U.S. Pat. No. 6,988,620 issued Jan. 24, 2006 to Clifton C. Haggard et al., discloses a wafer container having a top housing with sidewall tab portions that have a chamfered edge that pushes against a corresponding chamfered edge in the bottom housing to push extensions against the wafers. In this patent the hinge bends from the bottom housing and can bow whereby making contact with some but not all of the wafers. The hinge does not swing from the sidewall of the wafer carrier and the contact point on the wafers is not distal from the hinge to evenly apply the force to the wafers.

U.S. Pat. No. 5,402,890 issued Apr. 4, 1995 to Toshitsugu Yajima et al., discloses a box container with a flexible liner box member that is placed between the top and bottom housings. There are wedge like ribs that slide on the inside sidewalls that push the liner box member against the sheet bodies placed within the enclosure. The interaction of closing the housing causes deformation of one part that makes contact with all of the sheet bodies within the housing. This patent requires a separate insert to provide the cushioning and the cushion is not integrated or hinged from either housing.

U.S. Pat. No. 5,024,329 issued on Jun. 18, 1991 to Peter Grohrock discloses a wafer shipper that uses a hinged movable sidewall. This sidewall has multiple living hinges that push a wafer securing means against the wafers when the bottom housing is secured into the top housing. The interaction of closing the housing causes deformation of one part that makes contact with all of the wafers within the housing. In this patent the wafers are stored vertically. This cushion pushes from only one side and pushes the wafers against an outside wall where they are susceptible to damage. The top housing pushed down on the cushion instead of sliding on the cushion.

What is needed is a semiconductor wafer container with improvements in internal movement, side and top protection to the wafers, the improved wafer carrier has movable side walls that push against opposing sides of the wafer to eliminate movement of the wafer within the carrier. This pending application satisfies these requirements with novel improvements in the identified areas.

BRIEF SUMMARY OF THE INVENTION

It is an object of the semiconductor wafer container to limit the amount of radial movement of the wafer within in the container. Limiting radial movement is important because when shipping "bumped" wafers that must be stacked on spacer rings where the rings must only touch the periphery of the wafer will not shift radially into the areas containing the solder bumps. The improvements increase the wafer containment device's ability to protect semiconductor wafers and reduce radial wafer shift for both bumped and non-bumped wafers. This design can be used with or without spacer rings between the wafers in the vertical stack.

It is an object of the semiconductor wafer container to incorporate flexible wall segments. The flexible wall or wall segments moves radially inward to take up the excess space between the wafer and the main inner diameter of the container. The flexible walls reduce the movement of the wafers or can contain inserts that move with the walls to reduce the movement of the wafers. These wall segments create an interference fit between the top cover and panel or by use of a ramped engagement surfaces in either the Top Cover and/or the Bottom Member. The flexible wall segments can consist of individual components with flexible inserts, or can be integral to the base where they are molded as one part.

It is an object of the semiconductor wafer container to include flexible panels within a constraining wall. The flexible panel is contained within the main inner walls of the wafer container. The flexible wall segments can be simply a flexible portion of the wall or a distinct panel that reduces the radial gap between the wafer container and the wafer or wafer stack. This mechanism could also include the radial movement of resilient inserts imbedded into the side walls and are engaged by the top cover to move vertical features of the resilient insert radially inward.

It is another object of the semiconductor wafer container to include flexible inserts that are embedded onto or into the flexible wall. The insert is a flexible or resilient inserts, whether separate pieces or overmolded onto the walls, using a resilient materials. The wall may include holes or slots for insertion and retention of the insert.

It is still another object of the semiconductor wafer container to include ramped engagement surfaces. When the wall segments are pushed radially inward they are in a generally vertical direction. The use of ramped surfaces minimize the amount of force required to assemble the Top Cover and Bottom Member together when loaded with the wafer stack. The ramped surface is on the backside of the flexible wall or panel segment and has a corresponding ramp on the top cover which engages the flexible wall ramp and drives the panel radially inward.

Various objects, features, aspects, and advantages of the present invention will become more apparent from the following detailed description of preferred embodiments of the invention, along with the accompanying drawings in which like numerals represent like components.

BRIEF DESCRIPTION OF THE SEVERAL VIEWS OF THE DRAWING(S)

DETAILED DESCRIPTION OF THE INVENTION

Figure 1:
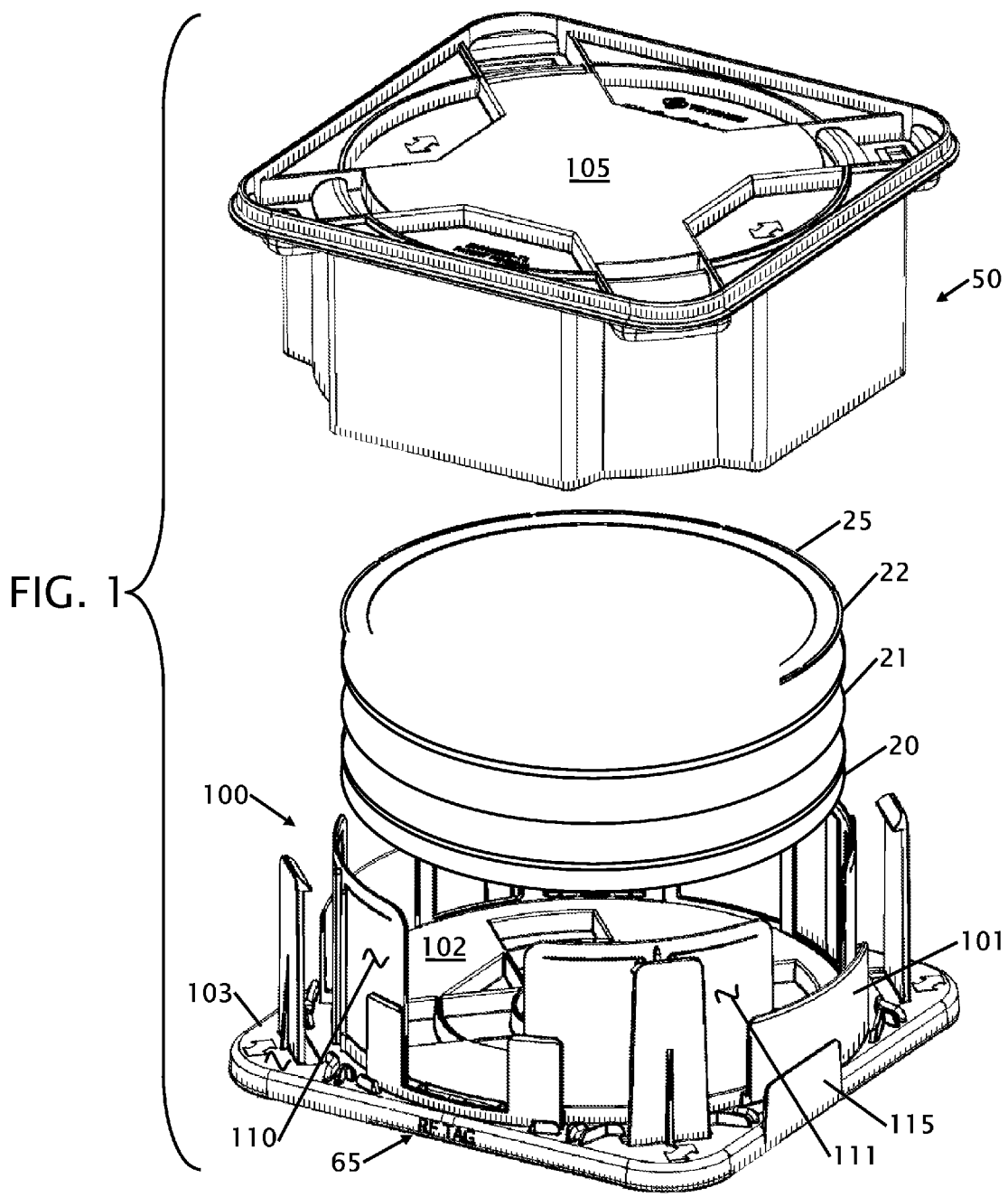
FIG. 1 shows a perspective exploded view of the wafer container with a plurality of wafers disposed between the two wafer container halves.

FIG. 1 shows a perspective exploded view of the wafer container with a plurality of wafers disposed between the two wafer container clam shells. A plurality of semiconductor wafers 20, 21 and 22 are shown between the top 50 and bottom 100 housing with wafer separators or spacer rings 25. The top housing 50 has a planar top surface 105. The inside base surface 102 extends to the outside of the base surface 103 where the bottom housing has a ribbed pattern 101 that supports the bottom of the bottom most semiconductor wafer 20 and provides increased structural strength to the fairly plainer base surface 102 and 103. Both the top 50 and the bottom housings 100 have essentially planar rectangular or square bases. A plurality of inner rib walls 110 and 111 that extend essentially perpendicular from the bottom housing 100 protect the semiconductor wafers 20-22 from shifting side damage. A rib 115 rises from the outer edge of the bottom housing to provide an area for labeling the wafer carrier. In addition to the label area, the wafer carrier has an area for a RF ID tag 65 (Also show in FIG. 5) to be inserted into the wafer carrier housing. This area is of the part is marked to identify the location of the RF ID to aid in scanning for the RF ID and eliminate the need to scan all the sides of the carrier to locate the RF ID.

The inner rib walls are formed in the top housing provide flexible wall segments that are bent with when the top housing 50 is inserted onto the bottom housing 100. In this preferred embodiment, there are four vertical ribs and each vertical rib has two flexible walls. When the walls are flexed, the walls push radially inward or concentrically into the center of the wafer carrier to reduce the inside diameter of the central cavity and to clamp the wafers 20-22, wafer separators and or space rings 25. This is shown and described in more detail in the FIGS. 2-6 of this application.

Figure 2:
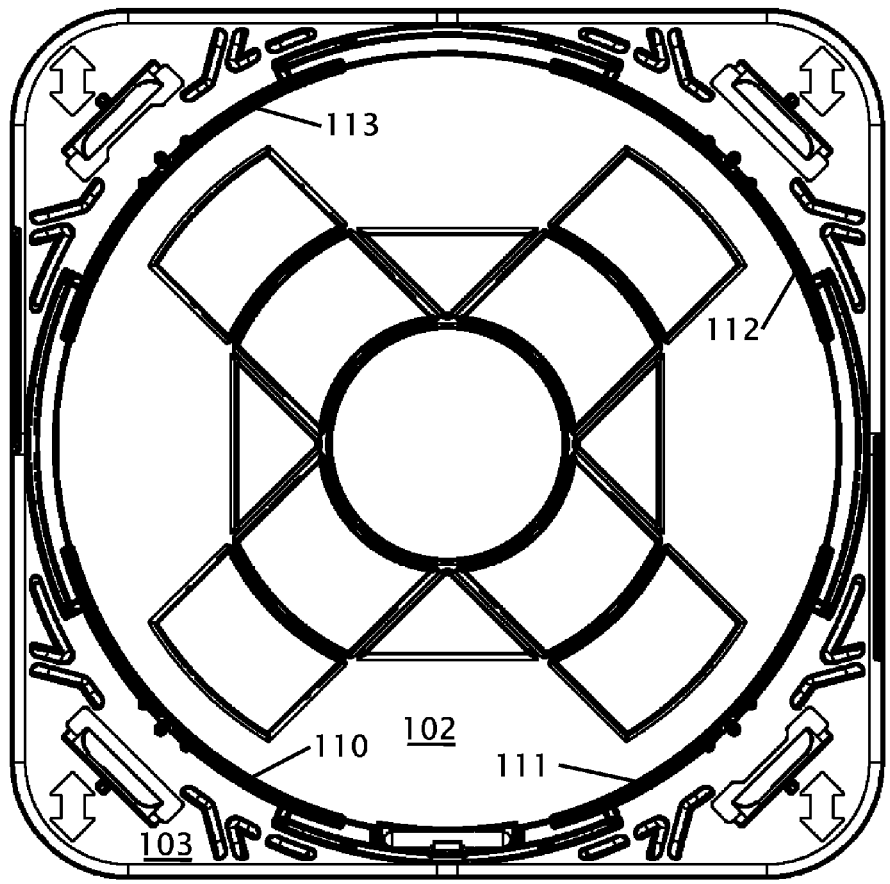
FIG. 2 shows a top view of the bottom housing with the ribs and the flexible walls.

FIG. 2 shows a top view of the bottom housing with the ribs 110, 111, 112 and 113 all having two each flexible walls. The flexible wall is better shown with FIG. 3 that shows a perspective view of the rib with two flexible wall segments 122 and 123 on rib 110. Each flexible wall 122 and 123 has an associated boss, 124 and 125 respectively, that is pushed upon by a mating rib located in the top housing. As the top housing is pushed down onto the bottom housing, the bosses 124 and 125 are pushed towards the center of the wafer carrier.

The walls 122 and 123 will flex on the outer restrained portion of the rib 110 and bends into the center of the wafer carrier. Because there are eight flexible walls located around the wafer carrier the walls all will move inward in unison to push in on the wafer from all directions to clamp the wafer into the center of the wafer carrier. Moving all of the walls together further prevents damage to the wafers because they are not being pushed in only one direction and when the top housing is removed the wafer do not move back into a neutral position because the wafers are all being clamped and released from a plurality of outer directions.

Figure 3:
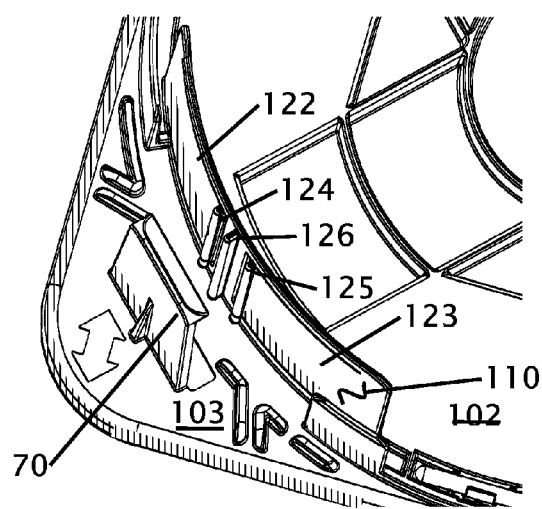
FIG. 3 shows a perspective view of the rib with two flexible wall segments.

In FIG. 3, one of the four centering ribs 126 is shown between bosses 124 and 125. This centering rib is located to assist in alignment of the top and bottom wafer carrier housings and provides stiffness to the vertical wall or rib. The locking tab or latch 70 is also shown in FIG. 3. The features and functions of the locking tab or latch 70 is shown and described in more detail in the inventor's other patent application Ser. No. 12/548,368 and 12/606,921 incorporated by reference herein. This is one of four latches that lock into slots located in the top housing to secure the two halves of the wafer carrier together during transportation of the wafers. The bosses 124 and 125 are pushed with ramped ribs that are located on the top housing. The ramped engagement ribs are shown and described with FIG. 4.

Figure 4:
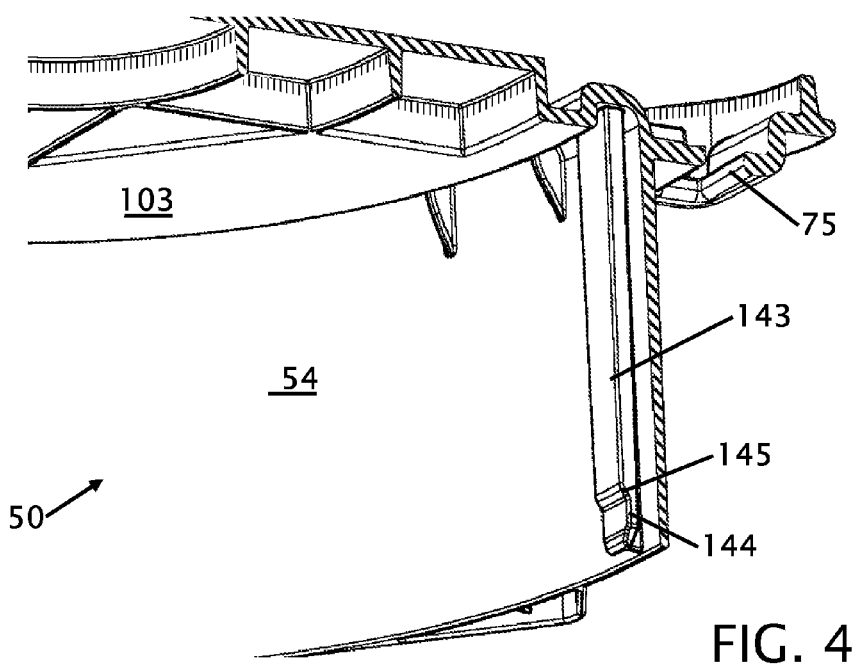
FIG. 4 shows a perspective cut away view of the top housing showing the ramped engagement rib.
Figure 5:
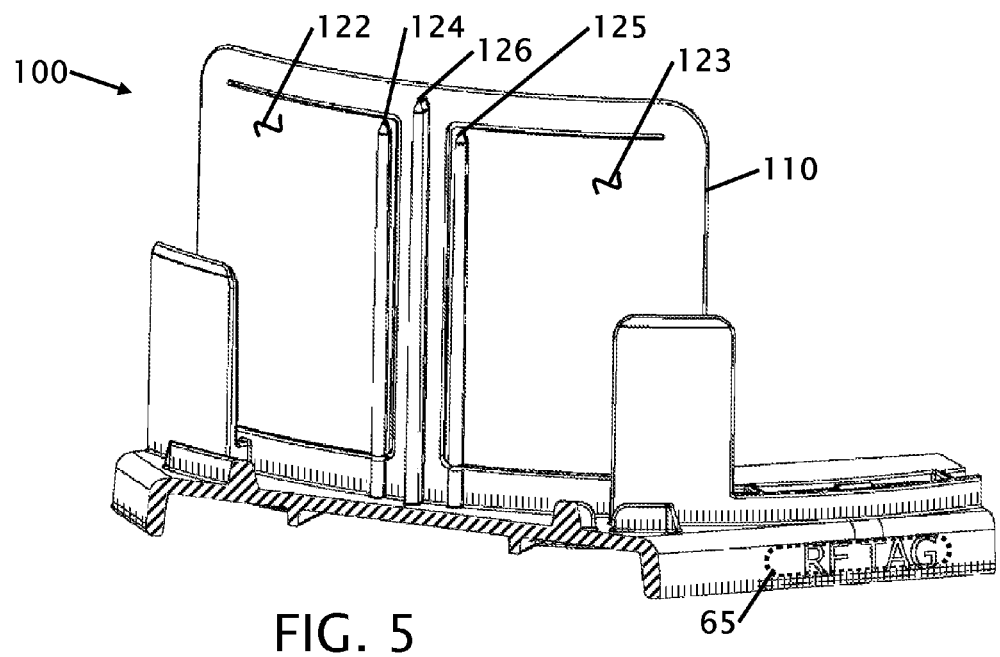
FIG. 5 shows a perspective cut away view of the bottom housing showing the flexible wall segments.

FIG. 4 shows a perspective cut away view of the top housing showing one of the eight ramped engagement rib. The top housing has been cut away to more clearly show rib 143 that extends from the outside rib wall 54. The outside rib wall 54 exists continuously around the wafer cavity to prevent contamination from entering into and or onto any stored semiconductor wafers that would be located within the wafer carrier. The rib 143 has a ramped or stepped wall section 144 that provides a start of engagement prior to pushing on the tapered area 145 of the bosses 124 and 125 on the lower housing as shown in FIG. 5. This figure also shows the notch 75 that engages with the locking tab 70 as shown in FIG. 3 that are described in more detail in the inventor's other patent application Ser. No. 12/548,368 and 12/606,921 incorporated by reference herein.

FIG. 5 shows a perspective cut away view of the bottom housing showing the flexible wall segments. In FIG. 5 the locking tab or latch 70 (shown in FIG. 3) has been removed to provide an unobstructed view of the flexible walls 122 and 123. The rib 143 (from FIG. 4) engages onto the bosses 124 and 125 to hinge the flexible walls 122 and 123 inward. A centering rib 126 is shown between the bosses 124 and 125. This centering rib passes between two ribs 143, located in top housing 50, to prevent the ribs 143 from pushing in an undesirable location on the bottom housing 100. Alignment is shown in more detail with FIG. 6.

Figure 6:
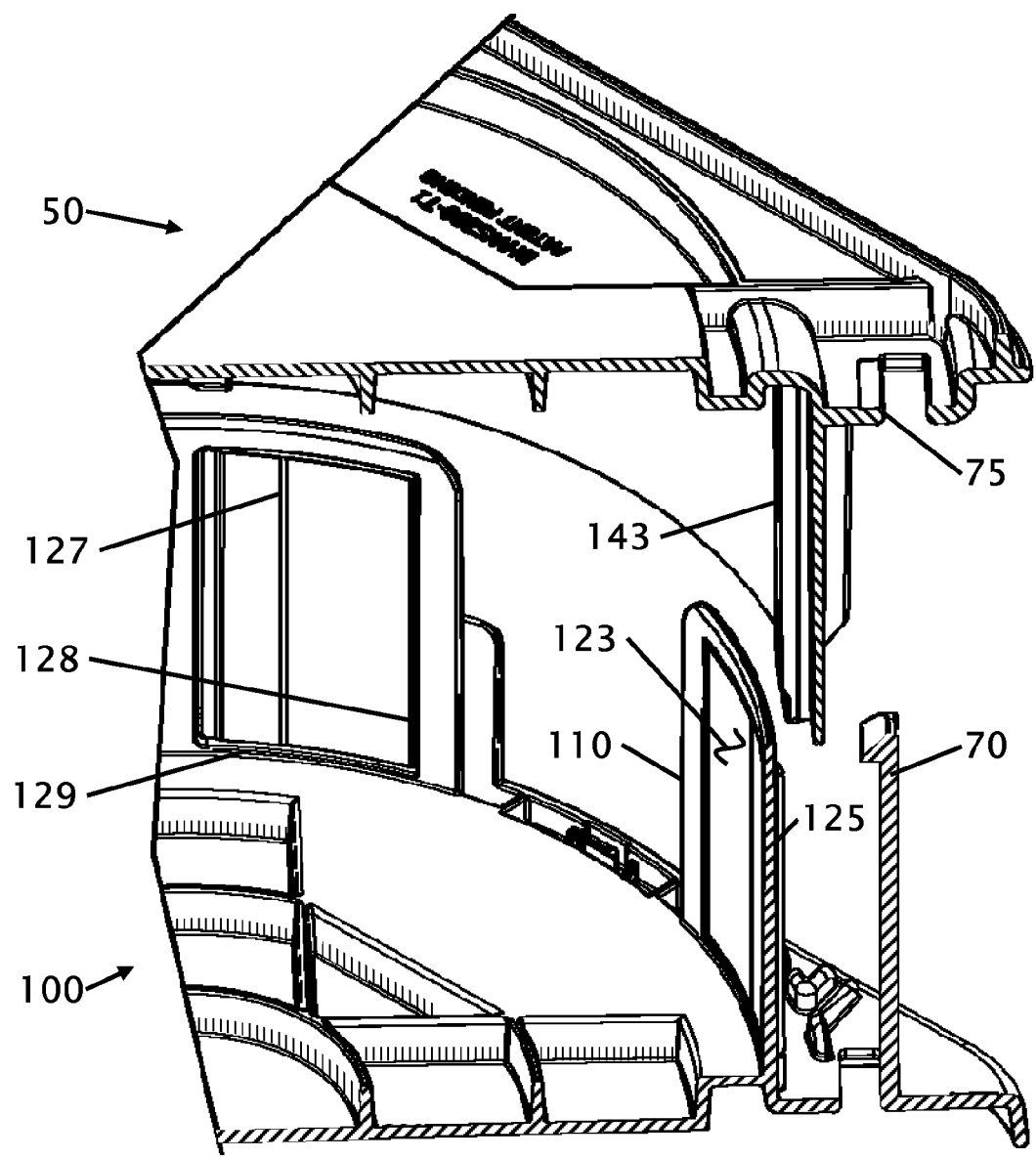
FIG. 6 shows a perspective cut away view of the flexible wall and the ramped engagement rib.

FIG. 6 shows a perspective cut away view of the flexible wall 123 on rib 110 of the bottom housing 100 and the ramped engagement rib 143 on the top housing. The top housing 50 is pushed down onto the bottom housing 100 until the locking tab or latch 70 engages and locks into the notch 75 in the top housing 50. To separate the two housings the locking tab or latch 70 is pushed out of the notch 75 and the housings can be pulled apart. As the housings are pulled apart the engagement rib 143 slides off of the boss 125 such that flexible wall 123 springs back away thereby releasing the wafers. In this figure, an insert or pad 127 is shown on the inside of the flexible wall. The pad 127 can be an inserted, over molded or integrated into or from the wall. This pad 127 is preferably an elastomeric and provides an additional cushion to the wafer as well as increasing the coefficient of friction of the flexible wall to grip the silicon wafers, or spacers. It should be noted that the location of this cushion or pad 127 is not placed at the hinge end or directly behind where a boss 125 would exist. The location of the cushion or pad 127 is paced between these two locations to allow the flexible wall to bend at the point of contact with the wafer(s). Because the point of contact is between the hinge location and the boss location the flexible wall provides additional flexing to further cushion the wafers. The cushions, pads or flexible inserts 127 can be embedded onto or into the flexible wall. The insert is a flexible or resilient inserts, whether separate pieces or over molded onto the walls, using a resilient materials. The wall may include holes or slots for insertion and retention of the insert. In this Figure, the living hinge area 128 is shown where the wall is thinned to allow for flexing. The living hinge is a hinge that is formed from the wall material where the wall material is unsupported on three sides. Pressure on the end of the free end of the hinge allows the wall to bend. The wall is thinned at location 128 to allows for easier flexing or hinging at a more localized area of the wall.

A radial support for the wafer ring 129 is also shown to support the lowermost wafer ring.

Thus, specific embodiments of a semiconductor wafer container have been disclosed. It should be apparent, however, to those skilled in the art that many more modifications besides those described are possible without departing from the inventive concepts herein. The inventive subject matter, therefore, is not to be restricted except in the spirit of the appended claims.

The invention claimed is:

1. A wafer container comprising:
    a top housing and a bottom housing, the bottom housing having an inner cavity for storage for at least one semiconductor wafer;
    the top housing having a base with at least one rib that extends perpendicular from the base of the top housing in an essentially circular orientation;
    the bottom housing having a base with at least one rib that extends perpendicular from the base of the bottom housing, wherein the at least one rib on the bottom housing is arranged concentric and at a different radius from the at least one rib that extends perpendicular from the base of the top housing, the at least one rib on the bottom housing having an arc angle of <360°;
    wherein the at least one rib on the bottom housing further includes at least one living hinge arranged normal to the base of the bottom housing wherein the living hinge is formed from at least one movable wall segment, wherein the at least one movable wall segment is a flexible panel within the at least one rib on the bottom housing, and wherein the at least one movable wall segment is unsupported on three sides;
    wherein the at least one movable wall has a first panel closing ramp, and
    the top housing has a second closing ramp configured to engage with the first panel closing ramp such that when the top housing is seated on the bottom housing the first closing ramp engages the second closing ramp to push the movable wall towards the inner cavity.

2. The wafer container according to claim 1 wherein a plurality of wall segments move radially to maintain the at least one semiconductor wafer concentric with the wafer container.

3. The wafer container according to claim 1 wherein the wall segments further include elastomeric inserts that are located between the wall segment and the at least one semiconductor wafer.

4. The wafer container according to claim 1 wherein the movable wall makes contact with the at least one semiconductor wafer at a location between the living hinge and the first closing ramp.

5. The wafer container according to claim 1 that includes at least two movable walls.

6. The wafer container according to claim 1 that includes at least four movable walls.

7. The wafer container according to claim 1 that includes at least eight movable walls.

8. A wafer container comprising:
    a top housing and a bottom housing the bottom housing having an inner cavity for storage for at least one semiconductor wafer;
    the top housing having a base with least one rib that extends perpendicular from the base of the top housing in an essentially circular orientation;
    the bottom housing having a base with at least one rib that extends perpendicular from the base of the bottom housing, wherein the at least one rib on the bottom housing is arranged concentric and at a different radius from the at least one rib that extends perpendicular from the base of the top housing, the at least one rib on the bottom housing having an arc angle of <360°;
    the bottom housing having at least one latch that extends essentially perpendicular from the base of the bottom housing, wherein the distance between the base of the bottom housing to the top surface of the latch is less than the distance between the base of the bottom housing and the top of the at least one rib on the bottom housing;
    the top housing having at least one latch well, the latch well having a bottom surface and a rim around the well, wherein the bottom surface is located below the surface of the base of the top housing, and wherein when the top housing is joined with the bottom housing, the top surface of the latch is lower than the rim around the well, and wherein the latch well comprises a notch configured to receive the at least one latch on the bottom housing;

wherein the at least one rib on the bottom housing has a plurality of flexible wall segments, wherein each flexible wall segment is a flexible panel within the at least one rib on the bottom housing, and wherein the at least one movable wall segment is unsupported on three sides;

each of the plurality of flexible wall segments have a first panel closing ramp;

the top housing is configured to engage with the first panel closing ramp such that when said the top housing is seated on the bottom housing the at least one rib on the top housing engages on the first panel closing rib to flex the wall segments radially inward to the inner cavity.

9. The wafer container according to claim 8 wherein the rib on the top housing further includes a closing ramp that engages on the first closing ramp.

10. The wafer container according to claim 8 wherein the closing ramps are stepped.

11. The wafer container according to claim 8 wherein the wall segments further include elastomeric inserts that are located between the wall segment and the at least one semiconductor wafer.

12. The wafer container according to claim 8 wherein the movable wall makes contact with the at least one semiconductor wafer at a location between the hinge and the first closing ramp.

13. The wafer container according to claim 8 that includes at least four movable walls.

14. The wafer container according to claim 8 that includes at least eight movable walls.

15. A wafer container comprising:

a top housing and a bottom housing the bottom housing having an inner cavity for storage for at least one semiconductor wafer;

the top housing having a base with least one rib that extends perpendicular from the base of the top housing in an essentially circular orientation;

the bottom housing having a base with at least one rib that extends perpendicular from the base of the bottom housing, wherein the at least one rib on the bottom housing is arranged concentric and at a different radius from the at least one rib that extends perpendicular from the base of the top housing, the at least one rib on the bottom housing having an arc angle of <360°;

the bottom housing having at least one latch that extends essentially perpendicular from the base of the bottom housing, wherein the distance between the base of the bottom housing to the top surface of the latch is less than the distance between the base of the bottom housing and the top of the at least one rib on the bottom housing;

the top housing having at least one latch well, the latch well having a bottom surface and a rim around the well, wherein the bottom surface is located below the surface of the base of the top housing, and wherein when the top housing is joined with the bottom housing, the top surface of the latch is lower than the rim around the well, and wherein the latch well comprises a notch configured to receive the at least one latch on the bottom housing;

wherein the at least one rib on the bottom housing further includes at least one hinge arranged normal to the essentially planar base and at least one movable wall segment that is articulable from the hinge such that the at least one movable wall segment can hinge to make contact with the at least one semiconductor wafer, wherein each flexible wall segment is a flexible panel within the at least one rib on the bottom housing, and wherein the at least one movable wall segment is unsupported on three sides.

16. The wafer container according to claim 15 wherein a plurality of wall segments move radially to maintain the at least one semiconductor wafer concentric with the wafer container.

17. The wafer container according to claim 15 wherein the at least one movable wall is articulated when the top housing is nested on the bottom housing.

18. The wafer container according to claim 17 wherein the articulation is with complimentary ribs located on the top and the bottom housings.

19. The wafer container according to claim 18 wherein at least one of the complimentary ribs on the top or the bottom housing is stepped.

20. The wafer container according to claim 15 wherein at least one of the complimentary ribs on the top or the bottom housing is ramped.

* * * * *